US006522752B1

(12) United States Patent
Smith

(10) Patent No.: US 6,522,752 B1
(45) Date of Patent: Feb. 18, 2003

(54) PARALLEL CHANNEL MULTI MODE MUSIC AMPLIFIER

(76) Inventor: Randall C. Smith, 1317 Ross St., Petaluma, CA (US) 94952

( * ) Notice: Subject to any disclaimer, the term of this patent is extended or adjusted under 35 U.S.C. 154(b) by 0 days.

(21) Appl. No.: 08/478,289

(22) Filed: Jun. 7, 1995

Related U.S. Application Data

(62) Division of application No. 08/124,126, filed on Sep. 17, 1992, now abandoned.

(51) Int. Cl.[7] .................................................. H03G 3/00
(52) U.S. Cl. .......................................... 381/61; 381/120
(58) Field of Search ............................ 381/61, 63, 118, 381/120

(56) References Cited

U.S. PATENT DOCUMENTS 4,180,707 A * 12/1979 Moog .......................... 381/61

* cited by examiner

*Primary Examiner*—Ping Lee
(74) *Attorney, Agent, or Firm*—James D. Ivey

(57) ABSTRACT

A multi-mode preamplifier for electric guitar comprising substantially parallel arrangement of at least two dissimilar channels of amplifying stages wherein one channel is dedicated to rhythm mode performance while the other is dedicated to one or more distortion producing modes.

3 Claims, 5 Drawing Sheets

PARALLEL CHANNEL MULTI MODE MUSIC AMPLIFIER

This application is a division of application No. 08/124,126, filed Sep. 17, 1992, now abn.

FIELD OF THE INVENTION

The present invention. More particularly, the invention relates to a multi-mode amplifier having at least one rhythm mode channel and at least one dissimilar, and alternately selectable, distortion mode channel, each channel devoted to producing the performance of an individual mode.

BACKGROUND OF THE INVENTION

Amplifiers for electric guitar offering two or more different modes of operation are well known and in use. Typically the two modes comprise one mode of substantially linear operation for undistorted "Rhythm" playing while the other mode offers distortion enhancement for "Lead" performance. Examples cited include the original "Dual Mode" patent of the present inventor: U.S. Pat. No. 4,211,893, which, having undergone several evolutionary improvements, remains at the time of this filing, a leading commercial product.

Other examples of dual mode architecture may also be cited including U.S. Pat. No. 4,701,957 (Smith) which teaches a simplified dual mode design, and in U.S. Pat. No. 5,012,199 (McKale), teaching a dual-mode design in which all tube stages remain active in all modes.

An important common denominator of all dual mode prior art is the use of a single signal path of amplifier stages arranged in a series fashion, one stage after the other. And although these units are commonly called "dual channel" or "channel switching", they are actually "single channel, dual MODE". This is important because the distinction between modes and channels is central to the present invention.

For clarity, a "channel" is correctly defined as a signal path, whereas a "mode" is an operating or performance characteristic. A given mode of performance would be the result of a signal having been processed by passing through a channel of amplification.

Before the advent of the distortion generating lead mode of the '893 amplifier, there was only one mode: clean rhythm. And even though dual channel amplifiers were well known and easily predate the '893 unit, both channels of such amplifiers were substantially alike: each had its own separate input terminal and each one provided only clean rhythm mode performance. The purpose was so that two guitars, or one guitar and a vocal microphone could be accommodated simultaneously by the one amplifier. Thus, examples of dual channel, single mode amplifiers are common.

The '893 amplifier was the first example of a dual mode amplifier, and the two modes—rhythm and lead—were selected alternately and both were produced within a single channel, series configured chain of amplifier stages. It is not an exaggeration to say that the introduction of the distortion mode of performance has left a permanent imprint on popular music because, when properly rendered, the lead distortion sound provides a new voice and an effective new realm of musical expression to the guitarist. The varying performance characteristics of the modes in the '893 amplifier and its stylistic followers are achieved by altering the gain structure of what is invariably a single channel signal path of gain stages arranged one after the other. By the addition of extra gain stages, and/or the altering of gain within the individual stages plus the interstage components, different performance modes are achieved. These amplifiers would be described as having dual or multi-performance modes all within a single channel.

As the '893 product evolved and finally arrived at its full, no-comprise performance stature, it required well over two dozen switching devices to enable the single channel circuit to deliver uncompromised multi-mode performance, including separate user controls dedicated to each. Thus, this created a strong need to develop an amplifier configuration that simplified the switching requirements, yet offered performance on a par with that of the fully embellished '893 product.

Simultaneous with the need for simplified switching requirements, there arose the need for an amplifier which could provide resolution to the dilemma of tone control location. Locating the tone controls near the input of the signal path yields superior rhythm mode performance because the signal amplitude is reduced and shaped to the appropriate EQ curve early on, thereby limiting unwanted overload of subsequent gain stages. Unfortunately, tone controls in this position are not so effective for heavy distortion performance because, as the signal undergoes further amplification in the massively, saturated distortion stages, it is the response curves inherent in these later stages which largely characterize the sound. At high settings of gain, saturation distortion occurs over the entire frequency range; thus frequencies boosted by the tone controls and present at the input to the distortion stages emerge from its output with less emphasis. The effect is somewhat like squeezing a pre-shaped form through an extrusion die: wherever the preshape exceeds the boundaries of the extrusion die, the part emerges resembling the extrusion die, not the input shape.

On the other hand, amplifiers with tone controls located at the end of the signal chain (or at least after the saturation stage(s), such as disclosed in U.S. Pat. Appl. Ser. No. 07/823,329, provide strong tone control action because subsequent stages operate substantially linearly and the effect described above is avoided. But achieving pristine clean sounds with these amplifiers can be difficult because a signal not attenuated and shaped early on is likely to cause unwanted saturation distortion before arriving at the tone controls.

Achieving maximum sonic performance in a multi-mode amplifier may further require a switch means to alter the operating voltages in accordance with mode selection such that differing power supply characteristics, which are individually optimized for each mode, are applied to the circuit in accordance with mode and/or channel selection.

The present invention substantially overcomes the limitations of the prior art by providing a parallel channel, multi-mode pre-amplifier which has at least two discrete amplifying channels, with at least one channel for a rhythm mode and at least another channel for a distortion mode including at least one distortion producing amplifier.

More specifically, the present invention provides a parallel channel, multi-mode pre-amplifier design, where each of the alternately selectable, parallel channels is devoted to producing the performance of an individual mode, i.e. rhythm or lead (distortion) mode. The present invention simplifies the complexity of the switching means required to provide improved performance in each stage of the design so that a tone control network may be optimally located within each channel for best performance the channel's mode. The tone control network for the rhythm channel(s) can thus be located near the input of the pre-amp, while the tone control for the lead channel(s) can be located after the distortion stage(s) which would generally be nearer to the output of the preamp. Further, a switchable low impedance/buffer stage may optionally be used to drive the tone control network which allows for different user-selectable dynamic responses.

In one embodiment, the present invention also provides a multi-mode, parallel channel amplifier which has a single set of programmable, user adjustment controls, thereby obviating the need for a further set of controls. In another embodiment of the present invention, two sets of independent, user adjustment controls are provided, each dedicated to a particular channel/mode. In the latter embodiment, the necessity for a switch means within the amplifying circuit is reduced in comparison to a single channel series amplifier of equivalent performance capabilities.

The present inventin also provides for an improved outboard effects interface system which, in one embodiment, includes a single master control per channel combined with an effect send level control, while the output level control doubles as an effect return level control.

The present invention further provides a power supply switch means which allows a parallel channel amplifier, having at least two modes, to switch between at least two different power supply configruarions so lthat each channel may receive power by an optimized power source.

It is therefore one object of the present invention to provide a multi-mode amplifier which reduces the complexity of the switching means required to provide improved performance in at least two modes.

It is another object of the present invention to provide a multi-channel amplifier kwhich has at least two alternately selectable, paralles channels, each of which is devoted to producing performance of an individual mode.

It is a further object of the present invention to reduce the complexity of the switching means required for an alternately selectable, parallel channel amplifier while not compromising the performance of each of the stages in the design.

It is a further object of the present invention to provide an alternately selectable, parallel channel amplifier which has a tone control network optimally located within each channel for the best performance of each channel's mode.

It is a still further object of the present invention to provide a switchable low impedance/buffer stage which may be used to drive the tone control network.

It is a still further object of the present invention to provide an improved outboard effect interface system which includes a one mastere control per channel, an effect mix control and an output level control.

It is also an object of the present invention to provide a power supply switch means which allows a paralles channel amplifier, having at least two modes, to switch between at least two different power supply configurations so that each channel may be powered by a optimized power source.

These and other objects of the invention will be better understood from the following Detailed Description of the Inventions, taken together with the attached Figures.

BRIEF DESCRIPTION OF THE DRAWINGS

FIG. 3 also illustrates and improved patch point and control system which enable outboard accessory devices to be effectively coupled into the signal path of a multi mode amplifier.

DETAILED DESCRIPTION OF PREFERRED EMBODIMENTS

Figure 1:
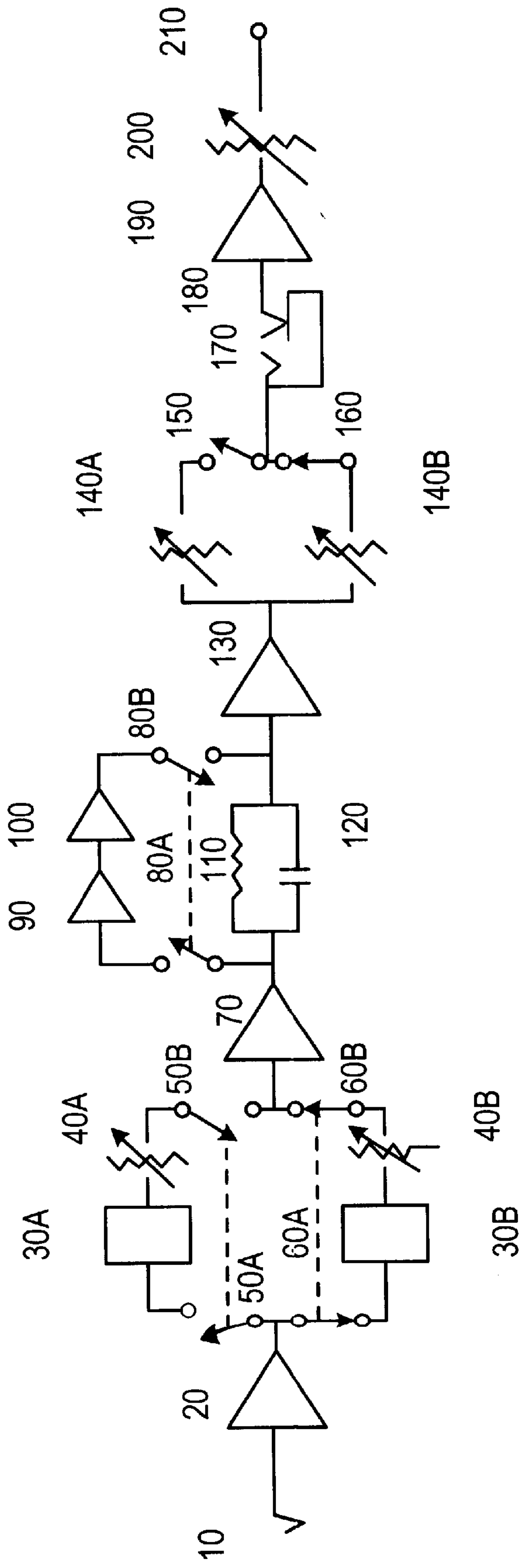
FIGURE 1 PRIOR ART
FIG. 1 is a block diagram of the prior art dual-or multi-mode amplifier in the single channel configuration of the 893 style.

The series configured, single channel, multi-mode prior art of FIG. 1 includes an input terminal 10 for coupling signal voltage from an electric guitar (not shown) into an input amplifier. The output of amplifier feeds one or more sets of tone controls 30A, 30B and gain controls 40A, 40B as determined by mode selection switch means 50A–B, 60A–B. For optimum performance in each of its modes, several individual circuit components relating to the input amplifier 20 would necessarily be switched in conjunction with the various modes such that the gain and frequency response of the input amplifier 2 are optimized. A tone-control recovery amplifier 70 restores gain lost through the network(s) of tone 30A–B, and gain controls 4R, 4L. Again, optimum performance in each of the various modes requires additional switch means such that preferred characteristics within the amplifier stage 70 may be provided. For non-distorted rhythm performance, the signal typically runs next through an attenuation pad 110 including a high pass filter 120 such that optimal frequency response is obtained. To provide the lead mode with its full saturation capabilities, an additional pair of ganged switches 80A–B, are required so that signal output from amplifier 70 is coupled into one or more distortion saturation amplifiers 40, 100 whose output is coupled into a mixing amplifier 130 alternately with the attenuated rhythm mode signal from the pad 110. The amplifier stage 130 may require yet further switch means enabling it to provide optimal sonic performance in accordance with whichever mode has been selected. The output from the mixer amplifier 130 next undergoes variable attenuation at one or the other master controls shown at 140A–B, again requiring a pair of alternate selection switches 150, 160. These controls 140A–B, provide individual adjustment of the loudness of each mode, particularly in conjunction with the gain of each mode as determined not only by the relevant circuit, but by settings of the appropriate gain controls 40A or 40B. The controls 11L, 11R also determine the amplitude of signal being delivered to the effect send terminal 170. The signal from the effect return terminal 180 is then coupled into an effect return amplifier 190 whose output is fed to the preamp output terminal 210 through a variable output level attenuator 200 whose setting determines the overall loudness of the unit, such that the loudness can easily and quickly be adjusted without disturbing the relative settings of the individual modes.

Figure 2:
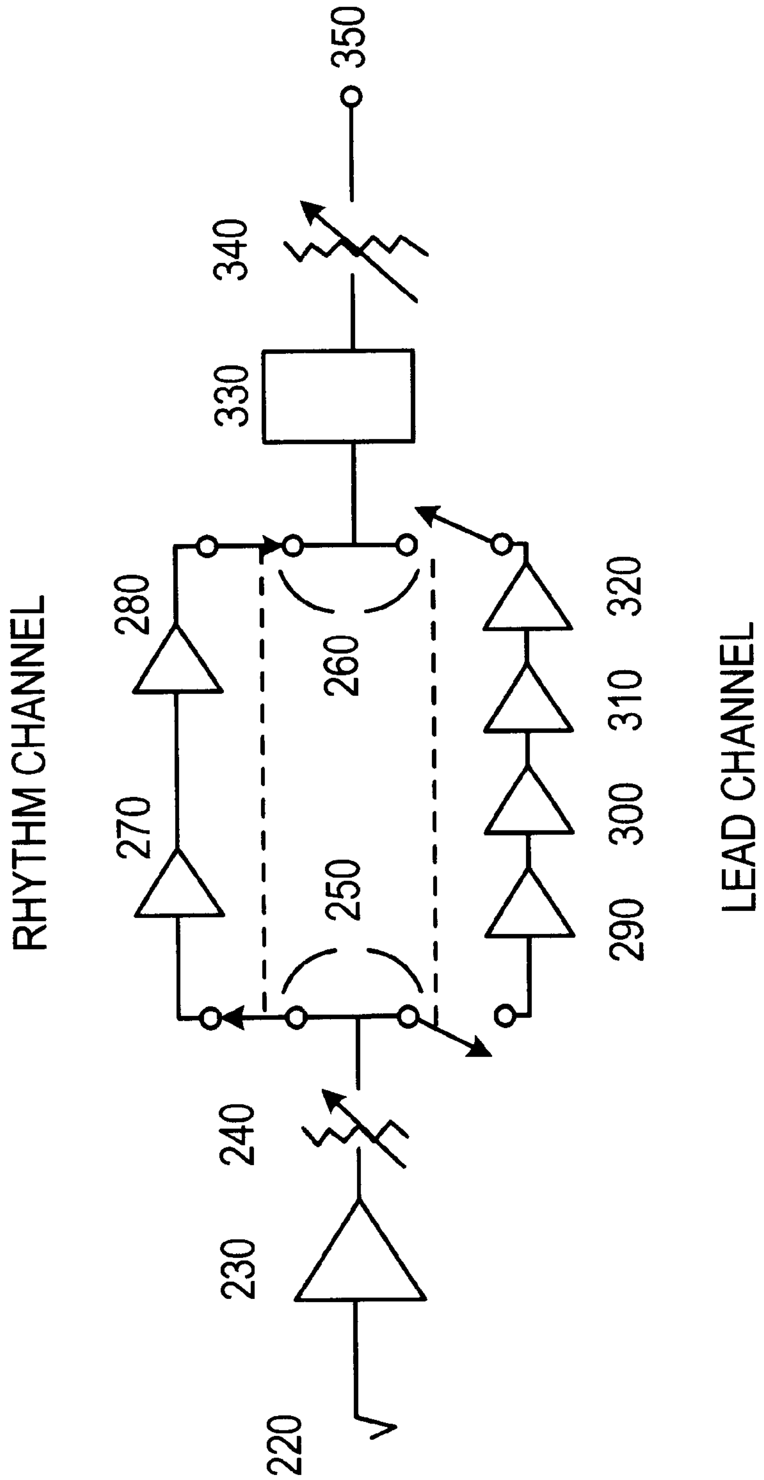
FIG. 2 is a block diagram of one embodiment of the present invention showing a dual parallel channel amplifier including a single set of user controls and suitable as an economical "entry level" instrument, or also as a compact size, outboard accessory unit for use in conjuction with another amplifier. Alternatively, the FIG. 2 embodiment is also suitable as the basis of an amplifier with a single set of programmable controls.

Referring now to FIG. 2, a first embodiment of the present invention includes an input terminal 220 for receiving signal voltage from an electric guitar and conducting it to first stage 230 (which may or may not include some gain), and which primary function is to provide buffering between the guitar (not shown) and a gain control 240 common to both rhythm and lead channels. A variable amplitude signal from the gain control 240 is alternately routed via a switch means 250 into one or the other of two (or more) parallel channels of amplification, one channel of which is dedicated to rhythm mode performance, and at least one other channel which is capable of providing distortion enhanced lead mode performance. The rhythm channel amplifier of FIG. 2 includes a first stage 250 and a second stage 280 both of which are specifically tailored exclusively for rhythm mode amplification. The output from the rhythm channel is coupled via an output switch 260 (which works in conjunction with the input switch 250 into the tone control network 330. The lead channel of the amplifier (290–320) of FIG 2 comprise a serial of cascaded amplifiers optimized exclusively for distortion performance and; receiving the signal from the input switch 250 when switch 250 is in its alternate setting. A first lead amplifier 10 is followed by three more cascaded amplifier stages 11, 12, 13, ensuring a fully saturated last stage whose output is rich in distortion harmonics. The output from the final lead amplifier 320 is then coupled through the switch means 260 and into the tone control network 330. A final user control—the Master 340—receives the signal from either channel through the tone control network and enables its amplitude to be user adjusted to match the following circuitry 350 be it the input to a power amplifier, a recording console or—as would be the case when this embodiment is used as an outboard device—a separate integrated guitar amplifier.

Figure 3:
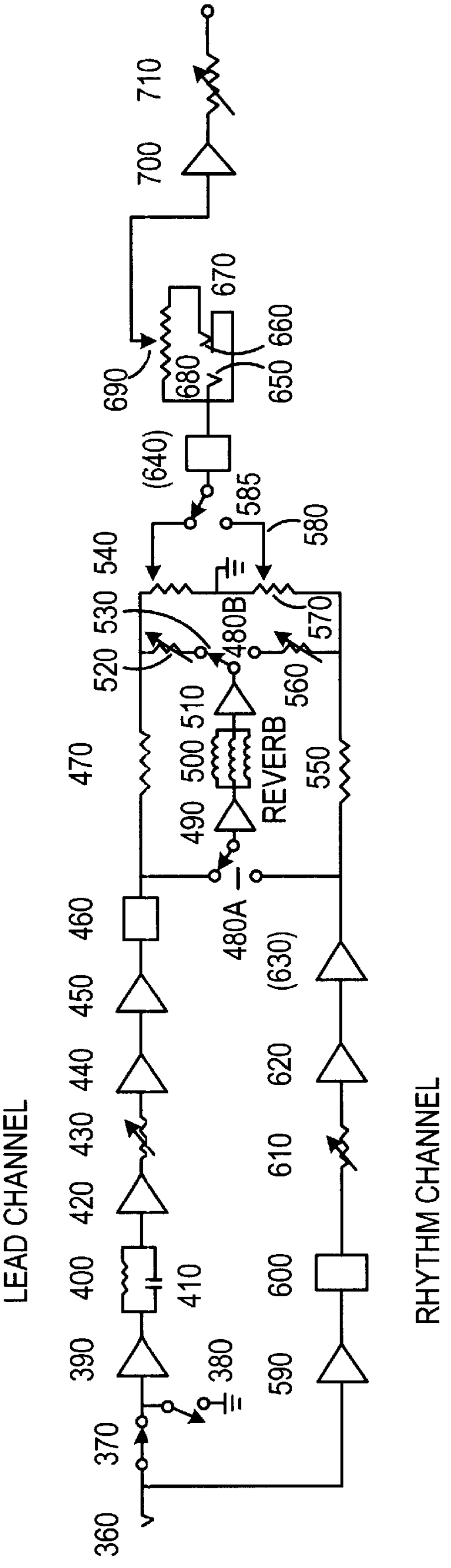
FIG. 3 is a block diagram of one embodiment of the present invention showing a dual parallel channel preamplifier including separate user controls for each channel and suitable for use with a higher power output amplifier.

When the characteristics of the individual stages of both rhythm and lead amplifiers have been optimized along with the fixed interstage components, it is possible to achieve satisfactory performance in the two modes without the requirement of re-adjustment of the single set of user controls 240, 330 as each alternate mode is selected. Referring next to FIG. 3, a second embodiment of the present invention includes an input terminal 360 for receiving signal voltage from an electric guitar. At this point, the signal is alternately coupled to the input circuitry of each of at least two substantially parallel channels: one dedicated to delivering rhythm mode performance, while the other is capable of producing the distortion enhance lead response. As will be appreciated by one skilled in the art, switching functions in this input area may vary somewhat according to the gain, layout, type of amplifying devices used and the stability of the circuit. And although slightly differing examples of switching configuration are illustrated in this and in the embodiment of FIG. 4, the basic parallel channel layout with its attendent benefits remains clearly visible. In the amplifier of FIG. 3, the signal may remain coupled from the input terminal 360 to the first rhythm amplifier 590 without causing excessive noise or interference when the lead mode is selected. To prevent noise and interference problems from occurring when the rhythm mode is selected, a pair of switches 370, 380 are utilized which work in opposition to one another. Switch 370, when closed, couples the input signal into the first lead amplifier 390 while switch 380 is simultaneously open, removing the shunt from the input element of lead amp 390 for lead mode performance; or oppositely: switch 370 opens (thereby preventing the signal from reaching the input of the first lead amp 390 while switch 380 closes shunting to ground the input element of lead amp 390 to provide quiet, stable performance of the rhythm channel. Continuing to follow the lead channel signal path, the amplified output from the first lead amplifier 390 is coupled through interstage elements 400, 410 to the input of a second lead amplifier 420. The output from this stage 420 is variably attenuated by the Lead Gain control 430 and fed to two following saturation amplifiers 350 the massively distorted output signal is then fed the tone controls 460. An attenuation pad comprising series resistor 470 and shunt resistor 530 comprising the fixed element of the Lead Master control 530 serves two purposes: first, the attenuation provides appropriate drive and return ports for the optional reverberation system; and second, signal amplitude before attenuation is much too great for driving either a power amplifier or outboard effect devices.

A high amplitude signal from the output of the tone controls 460 is selectably coupled to the input of the reverb driver amplifier 490 by a switch mean 480A in accordance with channel selection. This amplifier drives a conventional spring reverb delay line 500 whose weak output is amplified by the reverb return amplifier 510, then alternately switched to the chosen channel by switch 480B. Individual reverb level controls 530, 560 are provided for the rhythm channel and lead channel, respectively, without the requirement of switches other than 480B. Signal attenuation across the pad 470, 530 reduces amplitude to a level appropriate for mixing with the reverberated signal.

Signal output from the wiper element 540 of the lead master control 530, 540 then furnishes a low impedance, user adjustable signal well suited for driving either a power amplifier or outboard effect device which may be coupled to the effect send terminal 650. (One such effect device which may be built in at this location is an optional graphic equalizer 640 which may further be switched to activate automatically with the selection of either one channel or the other.) Thus the Master control of each channel (in this case the Lead Master 530, 540 and the Rhythm Master 29) each serve the dual functions of determining effect send level as well as respective channel volume to satisfy a player requirement for having one of the channels somewhat louder than the other channel. The Output Level control also serves twin purposes: first, as it follows the effect return amplifier stage, it functions as an effect return level control. Thus, if an outboard effect device requiring a large amplitude signal is plugged into the send and return terminal 650 and 660 then the individual channel master controls 540 and 580 may be turned up to provide sufficient signal drive Then the Output Level control, functioning as to. Then the Output Level control, functioning as an effect return level control, would necessarily be turned down to prevent the overall amplifier output from being too great. Likewise, the channel masters 530–540, 570–580 may be reduced to accommodate a low headroom outboard effect device, and in this case, the output level control 710, as a return sensitivity control, would be increased to bring overall loudness up appropriately. The secondary function of these controls is as volume and balance controls. For example, the independent masters (520–540, 570–580) enable the loudness of the rhythm mode and of the lead mode to be set individually. Then the loudness of the entire amplifier may be adjusted very easily by simply working the output level control 710. Thus, as the evening wears on and the band gets louder, the player using this system need only adjust one control—the Output Level 710—and overall loudness will increase without disturbing the relative loudness balance between the individual channels, or affecting the drive levels to any outboard devices under use. An important new element to this system is the inclusion of an effect mix control which is a variable resistor arranged such that the fixed element 680 is bridged between the send and return terminals 650, 660. Its adjustable wiper element 690 then serves as a sweep capable of panning to any point in between the unaffected signal (0%) and the fully effected signal (100%), and delivering a signal of appropriate mix into the effect return amplifier 700. Not only does this arrangement allow the user to select the "depth" of effect desired but, more important, it provides a direct path of non-effected signal in parallel with the outboard device. To the uninitiated, this may seem a small accomplishment, but the improvement is dramatic in preserving some of a good amplifier's most vital sonic characteristics which otherwise are seriously compromised when such an adjustable parallel path is not provided. Thus, this combination of elements: individual channel master controls 540, 580, an effect mix control 680 adjustable along a path parallel to the send 650 and return 660 effect terminals plus an output level control 710 provide greatly improved operating convenience and sonic performance.

A further bypass element 670 may be included which minimizes the effect of resistance in the circuit when the mix control 690 is unintentionally set above 0% while no devices are being utilized.

Returning now to the input terminal 360, the rhythm channel begins with first amplifier 2 (receiving the signal from the input input terminal 360 driving a set of rhythm tone controls 600. A rhythm gain control 25 provides variable amplitude drive to one (or more) following stages of amplification 620, (630), after which a combination attenuation pad 550 and rhythm master control 570–580 arrangement follows with the same design and purpose as the one 470, 530, 540 already described. Input to the reverb driver amplifier 490 is again selectively applied by switch 408B then reverb output is remixed to the unaffected, but attenuated signal via the action of switch 480B and rhythm channel reverb control 560. A final switch 585 alternately selects channel output and applies it to the following effect send/return circuit.

Figure 4A:
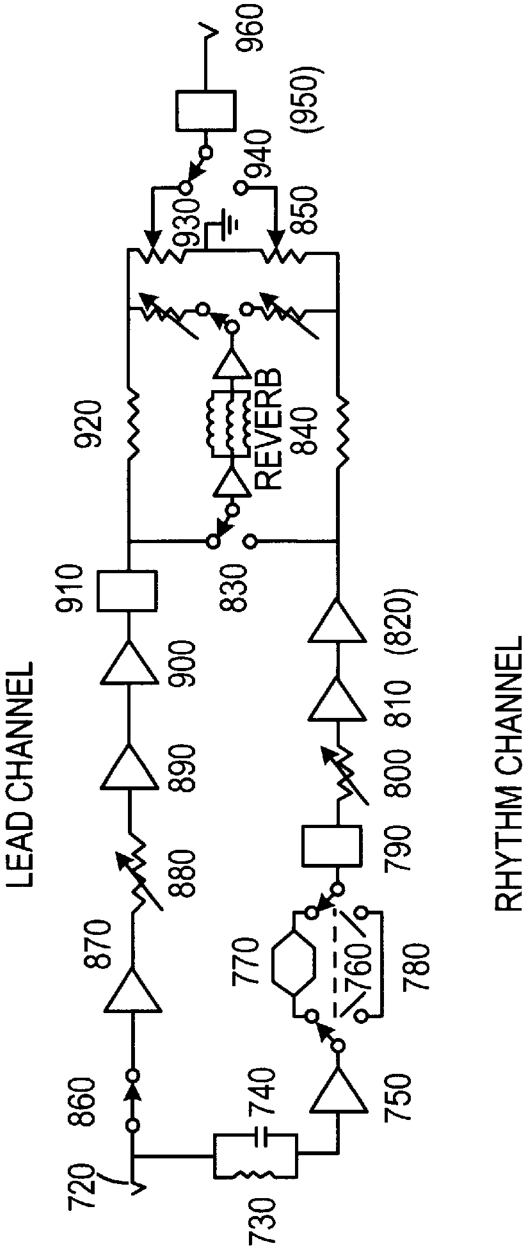
FIG. 4A is a block diagram of a similar embodiment to that of FIG. 3, yet more tailored for use with a lower power output amplifier where a higher proportion of overall distortion sound is more easily produced by the power amplifier section.

Referring now to FIG. 4A, another preferred embodiment of the invention offers performance particularly well suited to a medium power amplifier wherein the most desirable lead mode sounds are produced by combining power amp distortion with preamp distortion. Even though the dual parallel configuration of the preamp remains substantially like that of the circuit described in FIG. 3, there are some noteworthy modifications to the design.

Figure 4B:
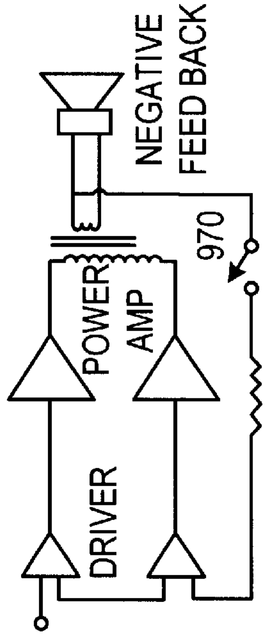
FIG. 4B also illustrates a user-switchable, low impedance tone control, driver stage which enables the musician to select between two differing amplifier dynamic characteristics.

An input terminal 720 receives signal voltage from an electric guitar which is coupled to a first rhythm amplifier stage 750 via an attenuation pad 730 combined with a high pass filter 740. Attenuating and pre-equalizing the signal ahead of the first rhythm amplifier 750 allows a more dynamic signal at the input terminal without exceeding the headroom of the first rhythm amplifier 750. The output from the first rhythm amplifier 750 is then coupled through a switched 760 which either includes or bypasses the optional low impedance driver stage 750. When included (as indicated by the position of the switches as shown) this stage—which may be a vacuum tube cathode follower—reduces the loading effect of the tone control network 790 on the output of amplifier stage 770 and "stiffens" the dynamic characteristic of the amplifier. The switch 760 in its alternate position disengages the buffer 770 and provides simple signal continuity from amplifier stage 2 into the tone control network 790, and from there, into the rhythm gain control 880. (Although the amplifier of FIG. 4A positions this switch buffer stage in the rhythm channel, it should be remembered that alternate locations—including some within the lead channel—may be utilized with much the same result of providing switchable dynamic characteristics. Besides providing a buffer stage for the tone control network 790, the low impedance driver stage 770 and the conductor 780 offer two different user-selectable dynamic responses. Because a guitar is by its nature a highly dynamic instrument and because the electronic amplifier is such a necessary and influential component, its dynamic response is a vital component to amalgamating the tactile sense of playing with the auditory sense of playing. Therefore, an amplifier having a selectable dynamic response characteristic provides the player with important additional versatility. When the low impedance stage 770 is included into the signal path, the guitar's sound takes on a harder, more cutting, characteristic and the added sonic punch seems like increased power and headroom—highly advantageous in loud playing situations. On the other hand, when the signal path follows the conductor 780, the dynamic characteristic takes on added bounce and resiliency and more subtle nuances appear and the amplifier responds with noticeably greater touch sensitivity. Although the preferred location for the low impedance stage 770 is directly before the tone control network, one skilled in the art will appreciate that there are other locations within an amplifying circuit that would provide similar advantages.) The variable amplitude signal is then coupled through one (or more) additional rhythm amplifier stages 810, 820, and from there, into an optional reverb drive selector switch 830 as well as into the series element of an attenuation pad 840 (like that described in FIG. 3) whose shunt element is the fixed resistance of the rhythm master control 850. The lead mode channel receives a signal from the input terminal 720 which is selectively coupled to the input of the first lead amplifier 870 through switch 860 which opens when the rhythm mode is selected. To shift the distortion performance balance in favor of the output section, the lead channel of the preamplifier of FIG. 4A includes one stage fewer of gain, thus a separate switch element shunting the lead channel input to ground during rhythm performance (as seen at 580 in FIG. 3) is generally not required. Additional gain—this time in the power stage/driver circuitry—is provided by including a switch 970 in the negative feedback loop such that feedback is reduced or removed when the lead mode is selected as shown in FIG. 4B. This causes a substantial increase in driver/power stage sensitivity and shifts the overall circuit gain toward the power amp end—especially when front end gain has been reduced (by a reduction in the number of gain stages). With the exception of the omitted gain stage and switchable feedback just described, the lead channel of the amplifier of FIG. 4A is substantially the same as that pictured in FIG. 3. Output from the first lead amplifier stage 870 is coupled to the second lead stage 890 through the variable gain control 880. Output from the second stage 890 is further amplified through third lead stage 900 which drives the lead tone control network 910. Output from the tone controls is selectively switched 830 into the optional reverberation circuit and simultaneously attenuated through series resistor 420 and shunt 430 which is the fixed element of the lead, master control. Variable amplitude output from either the rhythm master 850 or the lead master 930 is selected by switch 940 which couples this output to the effect send terminal 960 through an optional graphic equalizer 950.

Figure 5:
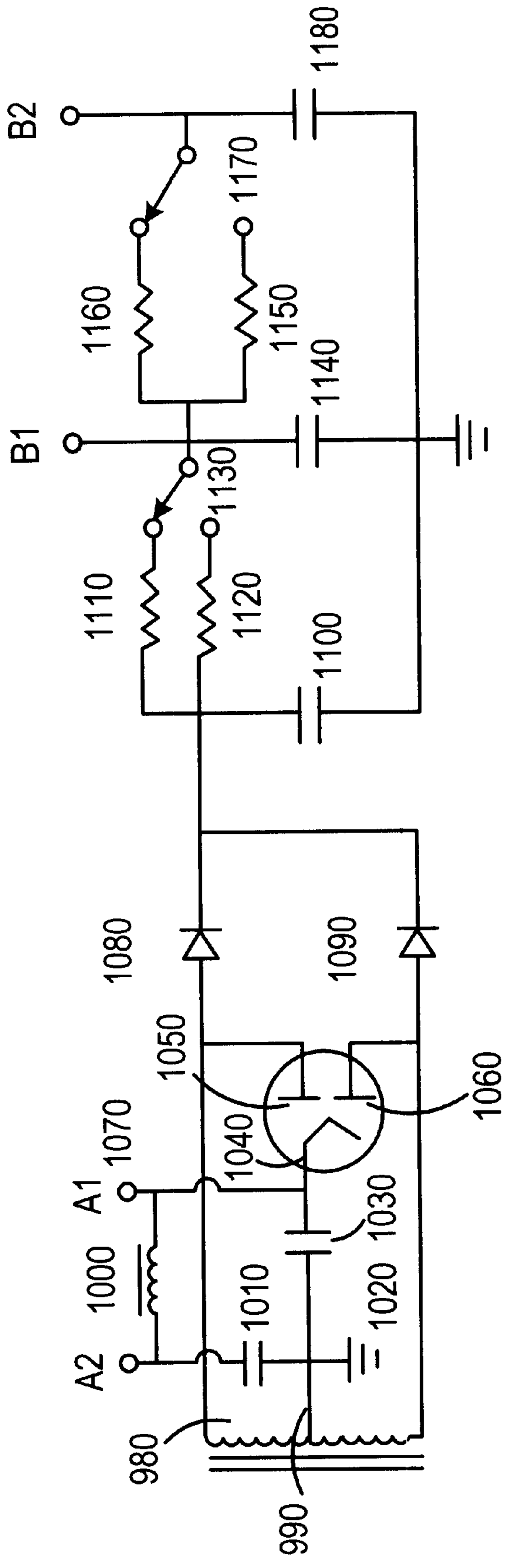
FIG. 5 is a block diagram of a power supply for use with a multi mode and/or multi channel amplifier wherein the operating voltages as applied to the audio circuitry are alternately switched in accordance with mode selection, and which further illustrates the simultaneous use of two different types of rectifier devices such that preferred voltages and preferred dynamic characteristics are provided.

Referring now to FIG. 5, a medium power amplifier, which achieves its best performance by blending preamp distortion with power amp distortion, has as its preferred power supply a configuration shown in FIG. 5. A high voltage secondary winding 980 is arranged for a full wave, center tapped rectifier configuration wherein the center tap 900 is connected to ground 1020 and opposite polarity AC feeds the anodes of a (preferably) vacuum tube rectifier. Pulsating DC from cathode 1040 is filtered through an input capacitor 1030 and delivered to a point Al which supplies the plate voltage to the power output tubes (not shown) through the primary winding of an audio output transformer (not shown). A filter choke 1000 (or resistor) in conjunction with a second filter capacitor 1010 furnishes a power supply point A2 which feeds the screen grid elements of the power output tubes (not shown).

A second power supply is also provided, separate from the first one just described, and comprises a second full wave rectifier—,this one employing silicon diodes 1080, 1090 to supply DC voltage to a second input capacitor 1100 Two or more resistors 1110, 1120 of different value are alternately coupled in accordance with channel or mode selection through a switch 1130 to a first point B1 which supplies high voltage current to a power output driver stage. Filtering is accomplished through a second capacitor 1140. A second pair of different value resistors 1150, 1160 deliver varying voltage to a point B2 depending on the position of switch 1170, which also works in conjunction with mode selection. The point B2 supplies current to the main high voltage rails of a pair of parallelly configured channels such that the voltage for each is optimized.

The power supply of FIG. 5 includes two novel features which may be utilized collectively (as shown), or individually, and thus this drawing is intended to be illustrative, but not limiting. In the medium power amplifier for which the power supply as shown is intended, optimum performance required a higher voltage be applied to the driver (and parts of the rhythm channel preamp) than was available (or desired) from the vacuum tube rectifier system. Also, the desired dynamic characteristic required stiffness in the preamp and driver (hence the use of silicon diodes with their constant voltage drop), but favored some voltage sag under load in the power section . . . thus the use of a vacuum tube rectifier which voltage drop is a function of load current. In certain other amplifiers however, optimum performance may be achieved with a single rectifier but still requires switching of voltage at one or more terminals in accordance with mode selection. And further, the refinement of switching the power supply voltage at one or more points applies equally to dual mode amplifiers in the single channel configuration.

The apparatus shown and described herein are illustrative of the principle of the invention and are not meant to be limiting of its scope. Various other embodiments will be apparent to those skilled in the art and may be made without departing from the spirit and scope of the invention as defined by the following claims:

What is claimed is:

1. An apparatus for patching an outboard accessory device into a signal path of a multi-channel amplifier, the apparatus comprising:

- a plurality of variable attenuators each coupled to a particular channel in the multi-channel amplifier for controlling a channel signal amplitude;
- a common effect-send terminal alternately coupled to one of the plurality of variable attenuators for receiving an output signal from the multi-channel amplifier, the common effect-send terminal optionally coupled to an input of an outboard accessory device;
- a common effect-receive terminal optionally coupled to an output of the outboard accessory device for receiving an outboard output signal;
- an effect-mix variable device which is electrically coupled in parallel with the common effect send and receive terminals and which is controllable by a user to combine a first user-selectable amount of signal directly from the common effect send terminal with a second user-selectable amount of signal directly from the common effect receive terminal to form a mixed signal; and
- a variably controllable amplifier means coupled to the effect-mix variable device for receiving the mixed signal and delivering an amplified output signal to an output terminal.

2. The apparatus of claim 1 wherein the effect-mix variable device is configured such that the first and second user-selectable amounts are necessarily inversely related.

3. An apparatus for patching an outboard accessory device into a signal path of a multi-channel amplifier, the apparatus comprising:

- a plurality of variable attenuators each coupled to a particular channel in the multi-channel amplifier for controlling a channel signal amplitude;
- a common effect-send terminal alternately coupled to one of the plurality of variable attenuators for receiving an output signal from the multi-channel amplifier, the common effect-send terminal optionally coupled to an input of an outboard accessory device;
- a common effect-receive terminal optionally coupled to an output of the outboard accessory device for receiving an outboard output signal;
- an effect-mix variable resistor which includes
  - a fixed element which is electrically coupled in parallel with the common effect send and receive terminals and which provides a fixed resistance between the common effect send and receive terminals; and
  - a variable element which is coupled to the fixed element to provide a panning output signal selectable along a length of the fixed resistance between the common effect send and receive terminals; and
- a variably controllable amplifier means coupled to the effect-mix variable resistor for receiving the panning output signal and delivering an amplified output signal to an output terminal.

* * * * *